(12) United States Patent
Okoroanyanwu et al.

(10) Patent No.: US 7,767,985 B2
(45) Date of Patent: *Aug. 3, 2010

(54) EUV PELLICLE AND METHOD FOR FABRICATING SEMICONDUCTOR DIES USING SAME

(75) Inventors: Uzodinma Okoroanyanwu, Northampton, MA (US); Ryoung-Han Kim, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 534 days.

This patent is subject to a terminal disclaimer.

(21) Appl. No.: 11/646,053

(22) Filed: Dec. 26, 2006

(65) Prior Publication Data

US 2008/0152873 A1 Jun. 26, 2008

(51) Int. Cl.
*G03F 1/00* (2006.01)
(52) U.S. Cl. ............... 250/492.2; 430/5; 428/14
(58) Field of Classification Search ............ None
See application file for complete search history.

(56) References Cited

U.S. PATENT DOCUMENTS

| | | | |
|---|---|---|---|
| 7,153,615 B2 * | 12/2006 | Bristol et al. | 430/5 |
| 2004/0175631 A1 * | 9/2004 | Crocker et al. | 430/5 |
| 2008/0113491 A1 * | 5/2008 | Wood et al. | 438/460 |

OTHER PUBLICATIONS

Mei Zhang, et al., "Strong, Transparent, Multifunctional, Carbon Nanotube Sheets", 309 Science, Aug. 19, 2005, pp. 1215-1219.

* cited by examiner

*Primary Examiner*—Jack I Berman
(74) *Attorney, Agent, or Firm*—Farjami & Farjami LLP

(57) ABSTRACT

According to one exemplary embodiment, an extreme ultraviolet (EUV) pellicle for use with a lithographic mask comprises a carbon nanotube film. The carbon nanotube EUV pellicle can be mounted on the lithographic mask. The carbon nanotube EUV pellicle protects the lithographic mask from contamination by undesirable particles and also prevents the undesirable particles from forming a focused image on the surface of a semiconductor wafer during fabrication; while advantageously, the carbon nanotube pellicle has a high level of EUV light transmittance.

14 Claims, 4 Drawing Sheets

EUV PELLICLE AND METHOD FOR FABRICATING SEMICONDUCTOR DIES USING SAME

TECHNICAL FIELD

The present invention is generally in the field of fabrication of semiconductor devices. More particularly, the invention is in the field of lithographic patterning of semiconductor wafers.

BACKGROUND ART

During semiconductor wafer fabrication, extreme ultraviolet (EUV) light can be utilized in a lithographic process to enable transfer of very small patterns, such as nanometer-scale patterns, from a mask to a semiconductor wafer. In EUV lithography, a pattern formed on an EUV lithographic mask (also referred to as an EUV reticle in the present application) can be transferred to a semiconductor wafer by reflecting EUV light off of portions of a reflective surface. A pellicle can be placed in front of the mask to, for example, avoid contamination of the mask and to prevent unwanted particles from reaching the mask surface, so as to avoid alteration of the pattern to be transferred by the mask.

Due to the very short wavelengths (high frequencies) used in EUV lithography, conventional pellicle materials absorb significant amounts of the EUV radiation, i.e. conventional pellicles are too opaque for EUV lithography. However, due to finer patterns in EUV lithography, the need for a properly functioning pellicle is even greater than conventional lithography.

SUMMARY

An EUV pellicle and method for fabricating semiconductor dies using same, substantially as shown in and/or described in connection with at least one of the figures, as set forth more completely in the claims.

DETAILED DESCRIPTION OF THE INVENTION

The present invention is directed to an EUV pellicle and method for fabricating semiconductor dies using same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
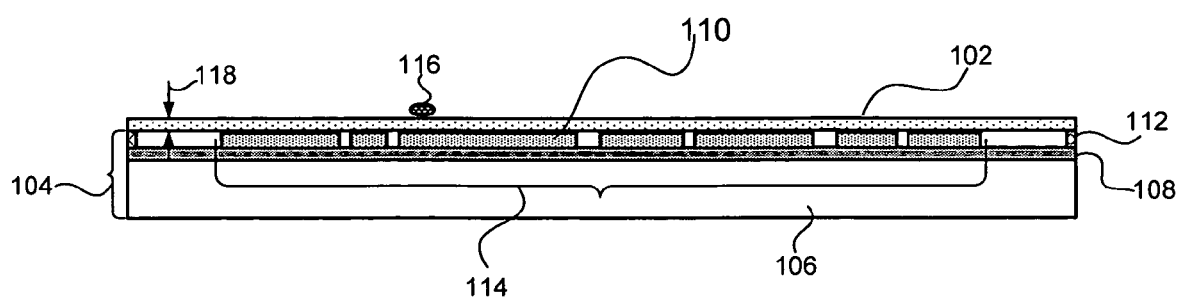
FIG. 1 illustrates an exemplary EUV pellicle attached to an exemplary EUV lithographic mask in accordance with one embodiment of the present invention.

FIG. 1 shows an embodiment of the invention's carbon nanotube EUV pellicle 102 attached to an exemplary EUV lithographic mask 104 (also referred to as EUV reticle 104 in the present application). EUV lithographic mask 104 is used in an EUV lithographic system to fabricate semiconductor wafers in accordance with one embodiment of the present invention. As shown in FIG. 1, EUV reticle 104 comprises substrate 106 upon which an EUV reflective film 108 and an EUV patterned absorbent film 110 are positioned. In the present embodiment, the substrate 106, reflective film 108, and patterned absorbent film 110 together make up the EUV lithographic mask or reticle 104. Secured upon EUV reticle 104 is EUV pellicle 102 comprising carbon nanotube film. Carbon nanotube EUV pellicle 102 is secured to EUV reticle 104 at its edges, as shown in FIG. 1 at exemplary bonding point 112. An EUV lithographic system can be utilized to transfer a pattern on EUV lithographic mask 104 to a semiconductor wafer in a lithographic process in an EUV lithography exposure tool during wafer fabrication.

As shown in FIG. 1, reflective film 108 is situated over substrate 106 and can comprise a multilayer film for reflecting EUV light. For example, reflective film 108 can comprise a number of alternating layers of molybdenum and silicon. Substrate 106 can comprise fused silica or other suitable material having a low thermal expansion co-efficient and can have a thickness equal to approximately 0.25 inches, for example. Also shown in FIG. 1, patterned absorbent film 110 is situated over reflective film 108 and includes pattern 114. Patterned absorbent film 110 can comprise a suitable EUV absorbing material as known in the art. Pattern 114, which can be lithographically transferred to a semiconductor wafer by reflective EUV light, can be formed by selectively removing portions of absorbing film 110 to expose corresponding portions of reflective film 108. During lithographic processing of a semiconductor wafer, only EUV light that strikes exposed portions of reflective film 108 is reflected and directed to the semiconductor wafer by optical components of the EUV lithographic system (not shown).

A method for securing carbon nanotube EUV pellicle 102 to EUV reticle 104 comprises microwave polymer welding through heating of a carbon nanotube film that is sandwiched between plastic parts. Another method for attaching carbon nanotube EUV pellicle 102 to EUV reticle 104 comprises applying adhesive material to the edges of pellicle 102. Yet another method for attaching carbon nanotube EUV pellicle 102 to EUV reticle 104 comprises forming a carbon nanotube aerogel film and attaching same on the reticle 104 using a frame.

Carbon nanotube pellicle 102 provides protection to EUV lithographic mask 104 by preventing undesirable particles, such as particle 116, from contacting mask 104 and, thereby, undesirably altering pattern 114 on the surface of the mask 104. Carbon nanotube pellicle 102 can protect lithographic mask 104 from particles with diameters larger than 10.0 nanometers, for example. Carbon nanotube pellicle 102 also keeps undesirable particles, such as particle 116, at a sufficient distance from pattern 114 to prevent such particles from being "printed" on a semiconductor wafer during lithography by ensuring that the image produced by such particles are out of focus with respect to the focal plane of the image from pattern 114, that is the image produced by such particles will be out of focus with respect to the surface of the semiconductor wafer. Accordingly, thickness 118 of carbon nanotube pellicle 102 is selected to ensure that the image from undesirable particles, such as particle 116, will be out of focus with respect to the surface of the semiconductor wafer. Typically thickness 118 of EUV carbon nanotube pellicle 102 is in the range of 1.0 to 5.0 nanometers, but other ranges can be used as desired.

Carbon nanotube pellicle 102 has a high EUV light transmittance and may be in an "aerogel" form of carbon nanotube. "Aerogels" are a class of open-celled mesoporous solid materials that typically comprise between 90.0% and 99.8% air and have densities ranging between approximately 1.1 milligrams (mg) per cubic centimeter ($cm^3$) and approximately 150.0 $mg/cm^3$. In general, a material has its lowest density when the material is in an aerogel form. In an aerogel form, a material has a higher EUV transmission, i.e., lower EUV absorption loss, than any other form of that material. At a nanoscale perspective, an aerogel structurally resembles a sponge and comprises a network of interconnected nanoparticles. An aerogel, due to the presence of Rayleigh scattering, has a transmission loss mechanism that a smooth solid film does not have. Rayleigh scattering is an optical phenomenon that takes place when white light scatters off of particles smaller than the wavelengths of light. Transmission loss due to Rayleigh scattering in an aerogel film can be minimized by reducing the size of the aerogel's nanopores. Carbon nanotube sheets or films are particularly advantageous from this standpoint because of the ease with which it is possible to adjust the pore diameter in carbon nanotube sheets or films.

To achieve a very low density, EUV pellicle 102 can be in the form of a carbon nanotube aerogel. Carbon nanotube aerogels can have a density of, for example, approximately 1.5 $mg/cm^3$. However, depending on the desired density and application, the density of carbon nanotube sheets or films can readily be increased up to approximately 500.0 $mg/cm^3$ by causing the as-produced carbon nanotube film to be adhered to a planar substrate, such as glass, many plastics, silicon, or certain metals.

As stated above, carbon nanotube pellicle 102 has thickness 118, which can be between approximately 1.0 nanometer and approximately 5.0 nanometers, for example. Even at a thickness of approximately 5.0 nanometers, carbon nanotube pellicle 102 can transmit a substantial portion of incident EUV light, for example it might transmit more than 97.0% of incident EUV light, which advantageously results in very little throughput loss in an EUV lithography exposure tool. Thickness 118 can be optimally selected to achieve a balance between structural strength, particle stopping power, and EUV transmission. Thus, the invention's carbon nanotube pellicle 102 can be thick enough to provide sufficient strength to allow the carbon nanotube film to be utilized without a supporting mesh and to trap particles, such as particle 118, while providing sufficiently high EUV light transmittance.

In one exemplary application, an EUV light source is situated over EUV pellicle 102 and provides a source of EUV light for transferring pattern 114 on the surface of lithographic mask 104 to a semiconductor wafer. Incident EUV light from EUV light source passes through carbon nanotube EUV pellicle 102 and strikes the surface of lithographic mask 104. More specifically, a portion of EUV light that strikes a portion of reflective film 108 that is not covered by absorbing film 110 is reflected back through carbon nanotube EUV pellicle 102 as reflected EUV light, which can pass through the optical components of the EUV lithographic system and be focused on a semiconductor wafer to produce a desired pattern thereon. In contrast, the portion of incident EUV light that strikes patterned absorbent layer 110 is absorbed and not reflected back through carbon nanotube pellicle 102. Thus, pattern 114 is transferred to, i.e. "printed on," a semiconductor wafer by the reflected EUV light, which is the portion of incident EUV light that is reflected from the patterned surface of lithographic mask 104.

Thus, by utilizing a carbon nanotube film and/or a carbon nanotube aerogel in an EUV pellicle to protect a lithographic mask, the present invention effectively protects the lithographic mask from unwanted particles that can undesirably alter a pattern on the mask's surface, while resulting in an increased EUV light transmittance compared to a conventional pellicle. As a result, the invention achieves an EUV pellicle that advantageously provides increased throughput in an EUV lithography system. Moreover, by utilizing a carbon nanotube film comprising an aerogel, the invention achieves an EUV pellicle with even greater EUV light transmittance.

Figure 2:
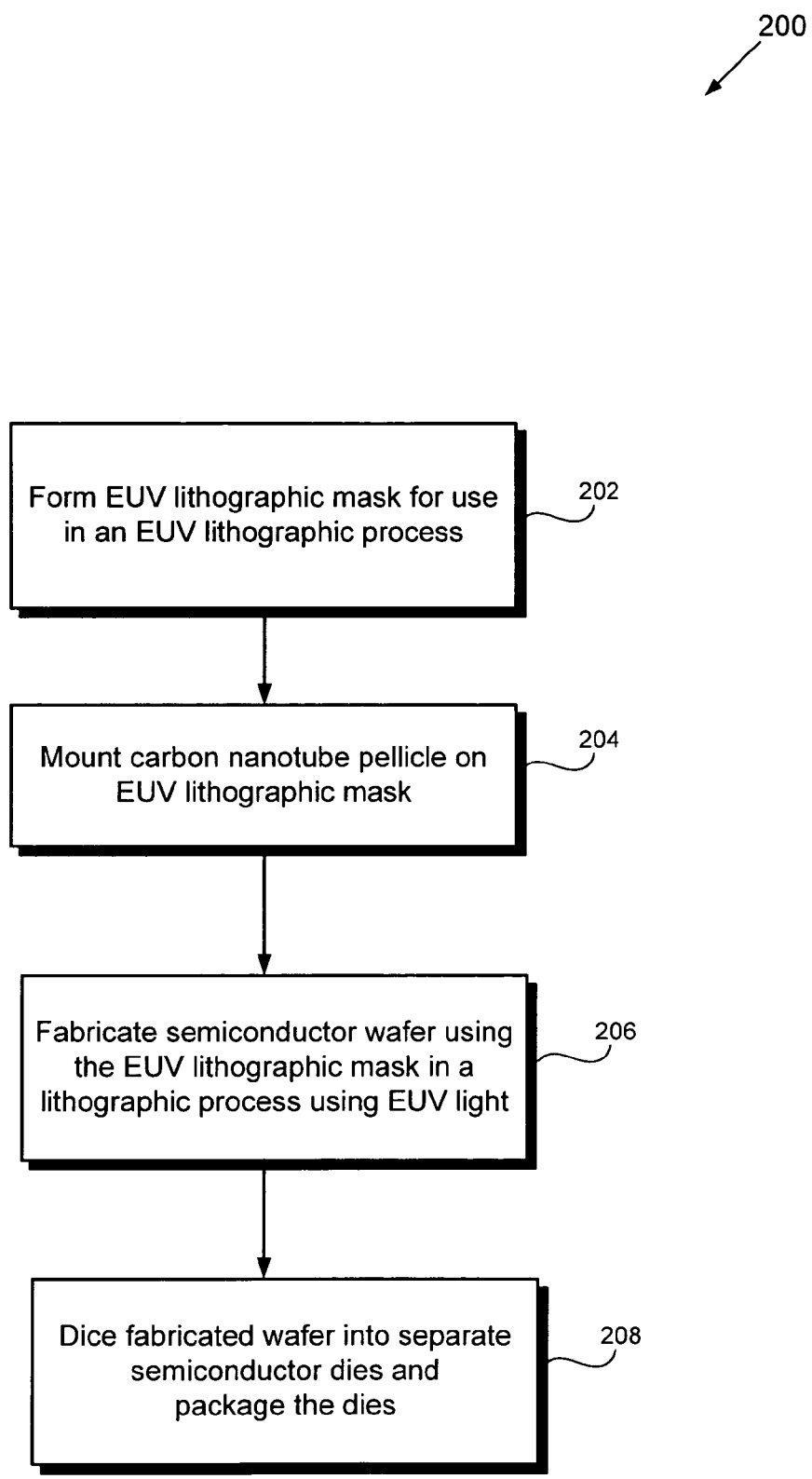
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may comprise one or more substeps or may involve specialized equipment or materials, as known in the art.

Referring now to step 202 of flowchart 200 in FIG. 2, lithographic mask 104 is formed. Formation of lithographic mask 104 comprises depositing reflective layer 108 on substrate 106, and then depositing absorbent layer 110 on reflective layer 108 to form pattern 114. Absorbent layer 110 may be etched on to reflective layer using methods well known in the art.

In step 204, EUV pellicle 102 comprising carbon nanotube film is mounted on, or alternatively attached and/or bonded to, lithographic mask 104 to protect lithographic mask 104 during an EUV lithographic process. Numerous methods for securing pellicle 102 to lithographic mask 104 are know in the art and such methods include bonding with adhesive, microwave welding, and securing pellicle 102 with a frame or other such structure.

Referring to step 206, a semiconductor wafer having one or more semiconductor dies, is fabricated using an EUV lithographic process. During the EUV lithographic process, pattern 114 on EUV lithographic mask 104 is transferred to a resist-coated semiconductor wafer by using an EUV lithographic system, using EUV light. During the EUV lithographic fabrication process, carbon nanotube pellicle 102 protects lithographic mask 104 from unwanted particles and provides significantly increased EUV light transmittance.

At step 208 of flowchart 200, the semiconductor dies can be separated from the semiconductor wafer in a dicing process after wafer fabrication has been completed. The fabricated and separated semiconductor die, which is fabricated by using the invention's carbon nanotube EUV pellicle for protecting a lithographic mask in an EUV lithographic process, can be a microprocessor die, for example. The diced and separate dies can be packaged, i.e. can be enclosed and/or sealed in suitable semiconductor packages, as known in the art.

Figure 3:
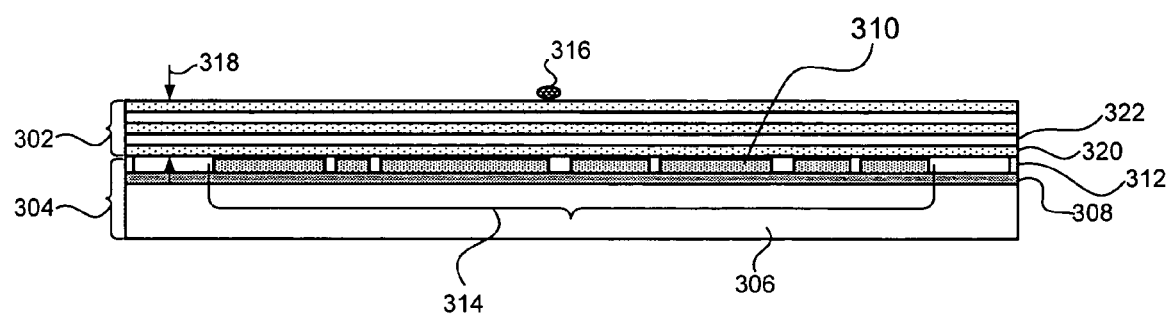
FIG. 3 illustrates an exemplary EUV pellicle attached to an exemplary EUV lithographic mask in accordance with one embodiment of the present invention.

FIG. 3 illustrates an alternative exemplary carbon nanotube EUV pellicle 302 that is attached to an exemplary EUV lithographic mask 304 (or EUV reticle 304). As illustrated in FIG. 3, reticle 304 comprises substrate 306 upon which an EUV reflective film 308 and an EUV patterned absorbent film 310 are positioned. Substrate 306, reflective film 308, and absorbent film 310 together comprise EUV lithographic mask or reticle 304. Resting upon reticle 304 is EUV pellicle 302 comprising, in one embodiment, multiple alternating layers of carbon nanotube film 320 and polymer film 322. An example of a material that may be used for polymer film 322 includes forms of a plexiglass film, such as a polysiloxane film and/or a polymethyl methacrylate film.

In this embodiment, pellicle 302 serves as a "protective lid" that is placed upon lithographic mask 304 to prevent particle contamination of the mask from, for example, undesirable particle 316 shown in FIG. 3. After lithographic mask 304 has been inserted into the EUV lithography exposure tool, EUV pellicle 302 can be removed in the vacuum chamber of the exposure tool just before using the lithographic mask 304. After use, pellicle 302 can be quickly placed on the lithographic mask 304 to protect it. Carbon nanotube pellicle 302 is attached to reticle 304 at its 304 edges, as shown in FIG. 3 at exemplary resting arm 312. Resting arm 312 comprises polymer film or other suitable material to support EUV pellicle 302 on lithographic mask 304.

As shown in FIG. 3, reflective film 308 is situated over substrate 306 and can comprise a multilayer film for reflecting EUV light. For example, reflective film 308 can comprise a number of alternating layers of molybdenum and silicon. Substrate 306 can comprise fused silica or other suitable material having a low thermal expansion co-efficient and can have a thickness equal to approximately 0.25 inches, for example. Also shown in FIG. 3, absorbent film 310 is situated over reflective film 308 and includes pattern 314. Absorbent film 310 can comprise a suitable EUV absorbing material as known in the art. Pattern 314, which can be lithographically transferred to a semiconductor wafer by reflective EUV light, can be formed by selectively removing portions of absorbent film 310 to expose corresponding portions of reflective film 308. During lithographic processing of a semiconductor wafer, only EUV light that strikes exposed portions of reflective film 308 is reflected and directed to the semiconductor wafer by optical components of the EUV lithographic system (not shown).

Carbon nanotube pellicle 302 provides protection to lithographic mask 304 by preventing particles, such as particle 316, from contacting lithographic mask 304 and, thereby, undesirably altering pattern 314 on the surface of the mask 304. Carbon nanotube pellicle 302 can protect lithographic mask 304 from particles with diameters larger than approximately 10.0 nanometers, for example.

Figure 4:
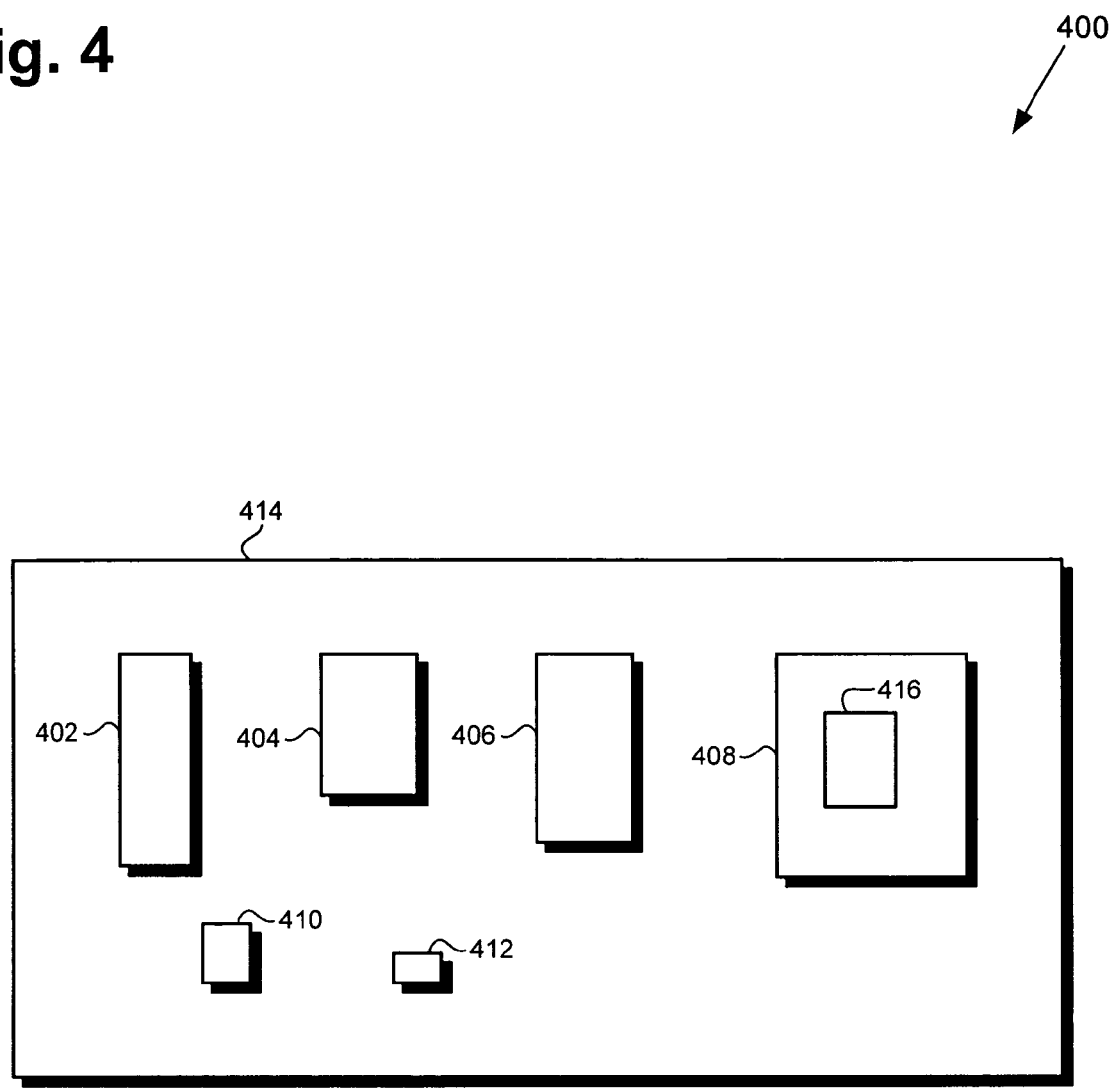
FIG. 4 illustrates a diagram of an exemplary electronic system including an exemplary chip or die fabricated by utilizing an EUV pellicle for protecting an EUV lithographic mask in accordance with one or more embodiments of the present invention.

FIG. 4 illustrates a diagram of an exemplary electronic system including an exemplary chip or die fabricated by utilizing an EUV pellicle for protecting a lithographic mask in accordance with one embodiment of the present invention. Electronic system 400 includes exemplary modules 402, 404, and 406, IC chip 408, discrete components 410 and 412, residing in and interconnected through circuit board 414. In one embodiment, electronic system 400 may include more than one circuit board. IC chip 408 can comprise a semiconductor die which is fabricated by using an embodiment of the invention's EUV pellicle, such as EUV pellicle 102 in FIG. 1. IC chip 408 includes circuit 416, which can be a microprocessor, for example.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is mounted on circuit board 414 and can comprise, for example, any semiconductor die that is fabricated by utilizing an embodiment of the invention's EUV pellicle. In one embodiment, IC chip 408 may not be mounted on circuit board 414, and may be interconnected with other modules on different circuit boards. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, by utilizing a carbon nanotube film in an EUV pellicle, the invention provides an EUV pellicle that effectively protects a lithographic mask from unwanted particles while advantageously providing significantly increased EUV light transmittance. By increasing EUV light transmittance, the invention's EUV pellicle advantageously increases an EUV lithography system's throughput during lithographic processing of semiconductor wafers.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an EUV pellicle and method for fabricating semiconductor dies using same have been described.

The invention claimed is:

1. An extreme ultraviolet (EUV) pellicle for use with a lithographic mask to fabricate a semiconductor wafer, said EUV pellicle comprising:

a low density and low EUV transmission loss aerogel carbon nanotube film capable of being mounted over said lithographic mask;

wherein said carbon nanotube film protects said lithographic mask from contamination by an undesirable particle and prevents said undesirable particle from forming a focused image on a surface of said semiconductor wafer;

said aerogel carbon nanotube film having said low EUV transmission loss due to a low Rayleigh scattering resulting from reduced size nanopore diameters.

2. The EUV pellicle of claim 1 further comprising at least one layer of polymer film situated over or under said carbon nanotube film.

3. The EUV pellicle of claim 1 wherein said carbon nanotube film transmits a substantial portion of incident EUV light.

4. The EUV pellicle of claim 1 wherein said EUV pellicle is mounted over said lithographic mask.

5. The EUV pellicle of claim 1 wherein said carbon nanotube film has a thickness in a range from approximately 1.0 nanometer to approximately 5.0 nanometers.

6. A method for fabricating a semiconductor wafer using extreme ultraviolet (EUV) lithography, said method comprising:

forming a lithographic mask;

mounting an EUV pellicle over said lithographic mask, said EUV pellicle comprising a low density and low EUV transmission loss aerogel carbon nanotube film, said aerogel carbon nanotube film having said low EUV transmission loss due to a low Rayleigh scattering resulting from reduced size nanopore diameters;

using EUV light to produce a pattern from said lithographic mask on said semiconductor wafer.

7. The method of claim 6 further comprising dicing said semiconductor wafer into a plurality of semiconductor dies.

8. The method of claim 7 further comprising packaging one or more of said plurality of semiconductor dies.

9. The method of claim 7 wherein one or more of said plurality of semiconductor dies are microprocessor dies.

10. The method of claim 6 wherein said EUV pellicle further comprises at least one layer of polymer film situated over or under said carbon nanotube film.

11. The method of claim 10 wherein said at least one layer of polymer film is selected from the group consisting of a plexiglass film, a polymethyl methacrylate film, and a polysiloxane film.

12. The method of claim 6 wherein said carbon nanotube film transmits a substantial portion of incident EUV light.

13. The method of claim 6 wherein said carbon nanotube film comprises a thickness in a range from approximately 1.0 nanometer to approximately 5.0 nanometers.

14. The method of claim 7, wherein one or more of said plurality of semiconductor dies are utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

* * * * *